United States Patent
Kim et al.

(10) Patent No.: US 10,394,120 B2
(45) Date of Patent: Aug. 27, 2019

(54) PHOTOSENSITIVE RESIN COMPOSITION, BLACK PIXEL DEFINING LAYER USING THE SAME AND DISPLAY DEVICE

(71) Applicant: SAMSUNG SDI CO., LTD., Yongin-si, Gyeonggi-do (KR)

(72) Inventors: Sang Soo Kim, Suwon-si (KR); Jinhee Kang, Suwon-si (KR); Heekyoung Kang, Suwon-si (KR); Chang-Hyun Kwon, Suwon-si (KR); Jiyun Kwon, Suwon-si (KR); ChanWoo Kim, Suwon-si (KR); Bumjin Lee, Suwon-si (KR); Junho Lee, Suwon-si (KR); Chungbeum Hong, Suwon-si (KR)

(73) Assignee: SAMSUNG SDI CO., LTD., Yongin-si, Gyeonggi-do (KR)

( * ) Notice: Subject to any disclaimer, the term of this patent is extended or adjusted under 35 U.S.C. 154(b) by 0 days.

(21) Appl. No.: 15/585,378

(22) Filed: May 3, 2017

(65) Prior Publication Data
US 2018/0157173 A1 Jun. 7, 2018

(30) Foreign Application Priority Data
Dec. 1, 2016 (KR) .................. 10-2016-0162839

(51) Int. Cl.
*G03F 7/004* (2006.01)
*G03F 7/027* (2006.01)
*G03F 7/028* (2006.01)
*G03F 7/038* (2006.01)
*H01L 51/52* (2006.01)
*G03F 7/00* (2006.01)

(52) U.S. Cl.
CPC .......... *G03F 7/0007* (2013.01); *G03F 7/0048* (2013.01); *G03F 7/027* (2013.01); *G03F 7/028* (2013.01); *G03F 7/0388* (2013.01); *H01L 51/5284* (2013.01)

(58) Field of Classification Search
None
See application file for complete search history.

(56) References Cited

U.S. PATENT DOCUMENTS

| | | | | |
|---|---|---|---|---|
| 8,105,752 B2 * | 1/2012 | Chou | ................ | C08G 73/1042 430/270.1 |
| 9,557,446 B2 * | 1/2017 | Kang | .................... | G03F 7/0387 |
| 2004/0096773 A1 * | 5/2004 | Jung | .................... | C08G 73/101 430/270.1 |
| 2006/0079658 A1 * | 4/2006 | Kato | .................... | G03F 7/0046 528/43 |
| 2007/0141509 A1 * | 6/2007 | Jeng | ........................ | G03F 7/027 430/270.1 |
| 2008/0096115 A1 * | 4/2008 | Tanabe | ................. | C07D 209/86 430/7 |
| 2009/0305046 A1 * | 12/2009 | Bito | ...................... | C08G 73/105 428/409 |
| 2010/0142189 A1 * | 6/2010 | Hong | ................... | C09K 11/616 362/97.3 |
| 2011/0200939 A1 * | 8/2011 | Lee | ........................ | C08G 73/10 430/280.1 |
| 2011/0212402 A1 * | 9/2011 | Chou | ...................... | G03F 7/037 430/286.1 |
| 2012/0133061 A1 * | 5/2012 | Mitsukura | .......... | C08G 73/1039 257/798 |
| 2012/0135251 A1 * | 5/2012 | Jeong | .................. | C08G 73/1025 428/448 |
| 2016/0018733 A1 * | 1/2016 | Lin | ...................... | C09D 179/08 430/283.1 |

FOREIGN PATENT DOCUMENTS

| | | | | |
|---|---|---|---|---|
| CN | 1793200 A | | 6/2006 | |
| CN | 103319713 A | | 9/2013 | |
| CN | 105085911 | * | 11/2015 | ............. C08G 73/10 |
| JP | 06-011832 | * | 1/1994 | ............. G03F 7/038 |
| JP | 2006-133757 A | | 5/2006 | |
| JP | 2011-180571 A | | 9/2011 | |
| KR | 10-2004-0058259 A | | 7/2004 | |
| KR | 10-2009-0065586 A | | 6/2009 | |
| KR | 10-2011-0030286 A | | 3/2011 | |
| KR | 10-2012-0057467 A | | 6/2012 | |
| KR | 10-1401145 | * | 6/2014 | ............. G03F 7/037 |
| KR | 10-1401145 B1 | | 6/2014 | |
| KR | 10-2015-0026302 A | | 3/2015 | |
| KR | 10-2016-0020229 A | | 2/2016 | |
| TW | 200725179 A | | 7/2007 | |
| TW | 201116554 A | | 5/2011 | |

OTHER PUBLICATIONS

Society of Chemical Industry, "Facile modifications of polyimide via chloromethylation: II. Synthesis and characterization of thermocurable transparent polyimide having methylene acrylate side groups", 2005, Xiang-Dan Li et al., vol. 54, No. 2, pp. 406-411.

(Continued)

*Primary Examiner* — Martin J Angebranndt
(74) *Attorney, Agent, or Firm* — Lee & Morse, P.C.

(57) ABSTRACT

A photosensitive resin composition, a black pixel defining layer, and a display device, the composition including a binder resin including a repeating unit represented by Chemical Formula 1; a black colorant; a photopolymerizable monomer; a photopolymerization initiator; and a solvent,

[Chemical Formula 1]

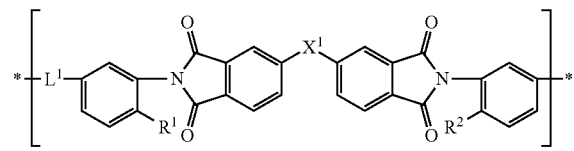

14 Claims, No Drawings

(56) References Cited

OTHER PUBLICATIONS

Search Report dated Dec. 24, 2017, which was attached to the Notice of Allowance dated Jan. 10, 2018, of the corresponding Taiwanese Patent Application No. 106115714.

* cited by examiner

PHOTOSENSITIVE RESIN COMPOSITION, BLACK PIXEL DEFINING LAYER USING THE SAME AND DISPLAY DEVICE

CROSS-REFERENCE TO RELATED APPLICATION

Korean Patent Application No. 10-2016-0162839 filed on Dec. 1, 2016, in the Korean Intellectual Property Office, and entitled: "Photosensitive Resin Composition, Black Pixel Defining Layer Using the Same and Display Device," is incorporated by reference herein in its entirety.

BACKGROUND

1. Field

Embodiments relate to a photosensitive resin composition, a black pixel defining layer using the same, and a display device.

2. Description of the Related Art

A photosensitive resin composition may be used to manufacture a color filter, a liquid crystal display material, a display device such as an organic light emitting diode, a display device panel material, or the like. For example, a color filter for a color liquid crystal display or the like may use a photosensitive resin layer such as a black pixel barrier rib layer on the border between colored layers (red, green, blue, or the like) to enhance display contrast or chromophore effects. This photosensitive resin layer may be formed of a black photosensitive resin composition.

SUMMARY

Embodiments are directed to a photosensitive resin composition, a black pixel defining layer using the same, and a display device.

The embodiments may be realized by providing a photosensitive resin composition including a binder resin including a repeating unit represented by Chemical Formula 1; a black colorant; a photopolymerizable monomer; a photopolymerization initiator; and a solvent,

[Chemical Formula 1]

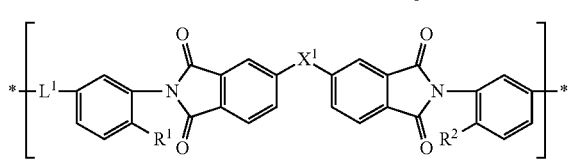

wherein, in Chemical Formula 1, $X^1$ is an oxygen atom, a sulfur atom, or a substituted or unsubstituted C1 to C10 alkylene group, $L^1$ is a single bond or a substituted or unsubstituted C1 to C10 alkylene group, and $R^1$ and $R^2$ are each independently a group represented by Chemical Formula 2,

[Chemical Formula 2]

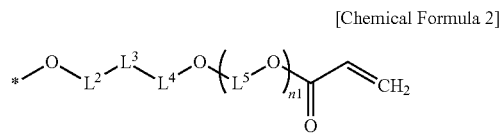

wherein, in Chemical Formula 2, $L^2$ and $L^4$ are each independently —C(=O)— or a substituted or unsubstituted C1 to C10 alkylene group, $L^3$ is a C6 to C20 arylene group including a pendant hydroxy group or a pendant carboxyl group or a C1 to C10 alkylene group including a pendant hydroxy group or a pendant carboxyl group, $L^5$ is a substituted or unsubstituted C1 to C10 alkylene group, and n1 is 0 or 1.

$L^3$ may be a group represented by Chemical Formula 2-1 or Chemical Formula 2-2:

[Chemical Formula 2-1]

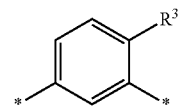

[Chemical Formula 2-2]

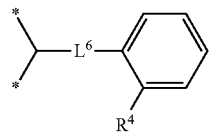

wherein, in Chemical Formula 2-1 and Chemical Formula 2-2, $R^3$ and $R^4$ are each independently a hydroxy group or a carboxyl group, and $L^6$ is an oxygen atom or —OC(=O)—.

$X^1$ may be an oxygen atom or a C1 to C10 alkylene group substituted with a halogen element-substituted C1 to C5 alkyl group.

$L^1$ may be a single bond or a C1 to C10 alkylene group substituted with a halogen element-substituted C1 to C5 alkyl group.

The binder resin may include a functional group represented by Chemical Formula 3 at a terminal end thereof,

[Chemical Formula 3]

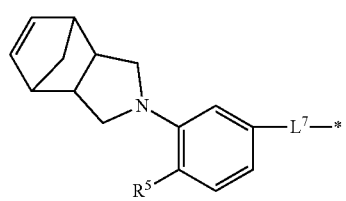

wherein, in Chemical Formula 3, $L^7$ is a single bond or a substituted or unsubstituted C1 to C10 alkylene group, and $R^5$ is a group represented by Chemical Formula 2.

The binder resin may have a weight average molecular weight of about 3,000 g/mol to about 20,000 g/mol.

The black colorant may include an organic black pigment.

The photopolymerizable monomer may include a compound including at least two functional groups represented by Chemical Formula 4:

[Chemical Formula 4]

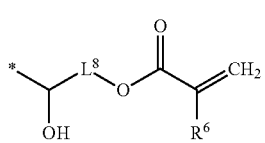

wherein, in Chemical Formula 4, $R^6$ is a hydrogen atom or a substituted or unsubstituted C1 to C10 alkyl group, and $L^8$ is a single bond or a substituted or unsubstituted C1 to C10 alkylene group.

The compound including at least two functional groups represented by Chemical Formula 4 may be a compound represented by Chemical Formula 5 or Chemical Formula 6:

[Chemical Formula 5]

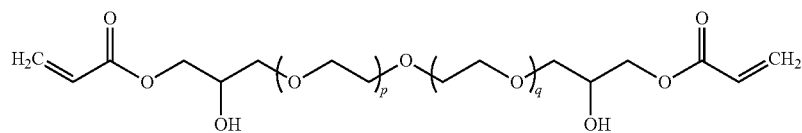

[Chemical Formula 6]

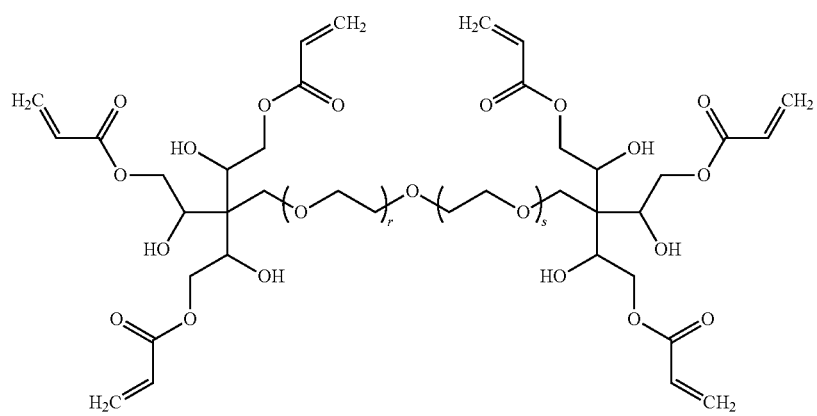

wherein, in Chemical Formula 5 and Chemical Formula 6, p, q, r, and s are each independently an integer of 1 to 10.

The photosensitive resin composition may include about 1 wt % to about 20 wt % of the binder resin; about 1 wt % to about 20 wt % of the black colorant; about 0.5 wt % to about 10 wt % of the photopolymerizable monomer; about 0.1 wt % to about 5 wt % of the photopolymerization initiator; and the solvent, all wt % being based on a total weight of the photosensitive resin composition.

The photosensitive resin composition may further include malonic acid, 3-amino-1,2-propanediol, a silane coupling agent, a leveling agent, a surfactant, a radical polymerization initiator, or a combination thereof.

The embodiments may be realized by providing a black pixel defining layer manufactured using the photosensitive resin composition according to an embodiment.

The embodiments may be realized by providing a display device comprising the black pixel defining layer according to an embodiment.

The display device may be an organic light emitting diode (OLED).

DETAILED DESCRIPTION

Example embodiments will now be described more fully hereinafter; however, they may be embodied in different forms and should not be construed as limited to the embodiments set forth herein. Rather, these embodiments are provided so that this disclosure will be thorough and complete, and will fully convey exemplary implementations to those skilled in the art.

It will also be understood that when a layer or element is referred to as being "on" another layer or element, it can be directly on the other layer or element, or intervening layers may also be present. In addition, it will also be understood that when a layer is referred to as being "between" two layers, it can be the only layer between the two layers, or one or more intervening layers may also be present.

As used herein, when specific definition is not otherwise provided, the term "alkyl group" refers to a C1 to C20 alkyl group, the term "alkenyl group" refers to a C2 to C20 alkenyl group, the term "cycloalkenyl group" refers to a C3 to C20 cycloalkenyl group, the term "heterocycloalkenyl group" refers to a C3 to C20 heterocycloalkenyl group, the term "aryl group" refers to a C6 to C20 aryl group, the term "arylalkyl group" refers to a C6 to C20 arylalkyl group, the term "alkylene group" refers to a C1 to C20 alkylene group, the term "arylene group" refers to a C6 to C20 arylene group, the term "alkylarylene group" refers to a C6 to C20 alkylarylene group, the term "heteroarylene group" refers to a C3 to C20 heteroarylene group, and the term "alkoxylene group" refers to a C1 to C20 alkoxylene group.

As used herein, when specific definition is not otherwise provided, "substituted" refers to replacement of at least one hydrogen atom by a halogen atom (F, Cl, Br, or I), a hydroxy group, a C1 to C20 alkoxy group, a nitro group, a cyano group, an amine group, an imino group, an azido group, an amidino group, a hydrazino group, a hydrazono group, a carbonyl group, a carbamyl group, a thiol group, an ester group, an ether group, a carboxyl group or a salt thereof, a sulfonic acid group or a salt thereof, a phosphoric acid group or a salt thereof, a C1 to C20 alkyl group, a C2 to C20 alkenyl group, a C2 to C20 alkynyl group, a C6 to C20 aryl group, a C3 to C20 cycloalkyl group, a C3 to C20 cycloalkenyl group, a C3 to C20 cycloalkynyl group, a C2 to C20 heterocycloalkyl group, a C2 to C20 heterocycloalkenyl group, a C2 to C20 heterocycloalkynyl group, a C3 to C20 heteroaryl group, or a combination thereof.

As used herein, when specific definition is not otherwise provided, "hetero" refers to inclusion of at least one heteroatom of N, O, S, and P in Chemical Formulae.

As used herein, when specific definition is not otherwise provided, "(meth)acrylate" refers to both "acrylate" and "methacrylate", and "(meth)acrylic acid" refers to "acrylic acid" and "methacrylic acid".

As used herein, when a definition is not otherwise provided, the term "combination" refers to mixing or copolymerization. In addition, "copolymerization" refers to block copolymerization to random copolymerization, and "copolymer" refers to a block copolymer to a random copolymer.

In chemical Formulae of the present specification, unless a specific definition is otherwise provided, hydrogen is bonded at the position when a chemical bond is not drawn where supposed to be given.

As used herein, when specific definition is not otherwise provided, "*" indicates a point where the same or different atom or Chemical Formula is linked. For example, * indicates a binding site to an adjacent atom.

A photosensitive resin composition according to an embodiment may include, e.g., (A) a binder resin including a repeating unit represented by Chemical Formula 1; (B) a black colorant; (C) a photopolymerizable monomer; (D) a photopolymerization initiator; and (E) a solvent.

[Chemical Formula 1]

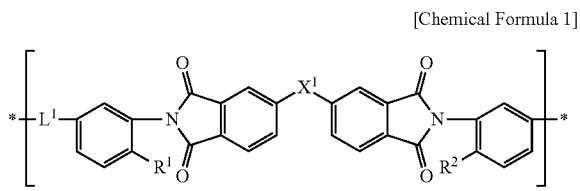

In Chemical Formula 1, $X^1$ may be or may include, e.g., an oxygen atom, a sulfur atom, or a substituted or unsubstituted C1 to C10 alkylene group, $L^1$ may be or may include, e.g., a single bond or a substituted or unsubstituted C1 to C10 alkylene group, and $R^1$ and $R^2$ may each independently be a group represented by Chemical Formula 2.

[Chemical Formula 2]

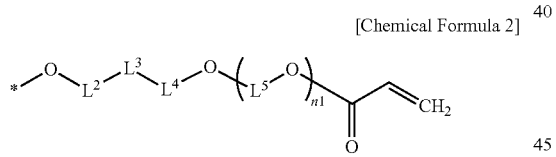

In Chemical Formula 2, $L^2$ and $L^4$ may each independently be or include, e.g.,*—C(=O)—* or a substituted or unsubstituted C1 to C10 alkylene group, $L^3$ may be or may include, e.g., a C6 to C20 arylene group including a hydroxy group or a carboxyl group at a terminal end thereof (e.g., a pendant hydroxy group or pendant carboxyl group) or a C1 to C10 alkylene group including a hydroxy group or a carboxyl group at a terminal thereof (e.g., a pendant hydroxy group or pendant carboxyl group), $L^5$ may be or may include, e.g., a substituted or unsubstituted C1 to C10 alkylene group, and n1 may be, e.g., 0 or 1.

Some binder resins for a photosensitive resin composition may not include a repeating unit represented by Chemical Formula 1, and the photosensitive resin composition may exhibit a deteriorating a contrast ratio when developed in an aqueous developing solution after the exposure to form a pattern. Accordingly, the contrast ratio could be improved by increasing a ratio of a photopolymerizable monomer and thus a photocurable ratio, but this may result in deteriorating heat resistance despite improving the contrast ratio.

The photosensitive resin composition according to an embodiment includes a binder resin may include the repeating unit represented by Chemical Formula 1. The composition according to an embodiment may have improved heat resistance, an improved contrast ratio, and a stable narrowed taper pattern (a low taper angle of about 25° to about 40°) and simultaneously improved sensitivity. For example, the repeating unit represented by Chemical Formula 1 may have a linking group including a pendant carboxyl group (and/or a hydroxy group), and a pattern formed by using an aqueous developing solution may lower a taper angle and improve sensitivity.

Hereinafter, each component is specifically described.

(A) Binder Resin

The binder resin in the photosensitive resin composition according to an embodiment may include the repeating unit represented by Chemical Formula 1, above. The binder resin has a linking group including a carboxyl group (and/or a hydroxy group) in the repeating unit represented by Chemical Formula 1, and the photosensitive resin composition including the same may use an aqueous developing solution during development. If an organic developing solution were to be used, developability could be deteriorated.

In an implementation, $L^3$ may be a group represented by Chemical Formula 2-1 or Chemical Formula 2-2.

[Chemical Formula 2-1]

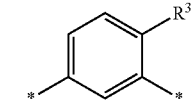

[Chemical Formula 2-2]

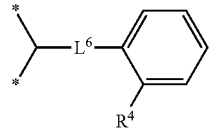

In Chemical Formula 2-1 and Chemical Formula 2-2, $R^3$ and $R^4$ may each independently be, e.g., a hydroxy group or a carboxyl group, and $L^6$ may be, e.g., an oxygen atom or *—OC(=O)—*.

In an implementation, $R^3$ and $R^4$ may each be a carboxyl group and $L^6$ may be *—OC(=O)—*.

In an implementation, n1 may be 1 and $L^3$ may be a group represented by Chemical Formula 2-1.

In an implementation, n1 may be 0 and $L^3$ may be a group represented by Chemical Formula 2-2.

In an implementation, $X^1$ may be, e.g., an oxygen atom or a C1 to C10 alkylene group substituted with a halogen element-substituted C1 to C5 alkyl group (e.g., a halogen containing C1 to C5 alkyl group). In an implementation, $X^1$ may be, e.g., an oxygen atom or a C1 to C10 alkylene group substituted with a trifluoroalkyl group-substituted C1 to C5 alkyl group. In an implementation, $X^1$ may be an oxygen atom or *—C(CF$_3$)$_2$—*.

In an implementation, $L^1$ may be, e.g., a single bond or a C1 to C10 alkylene group substituted with a halogen element-substituted C1 to C5 alkyl group. In an implementation, $L^1$ may be, e.g., a single bond or a C1 to C10 alkylene group substituted with a trifluoroalkyl group-substituted C1 to C5 alkyl group. In an implementation, $L^1$ may be, e.g., a single bond or *—C(CF$_3$)$_2$—*.

In an implementation, the binder resin may include a functional group represented by Chemical Formula 3 at a terminal end thereof.

[Chemical Formula 3]

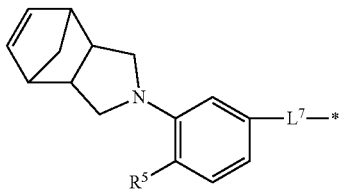

In Chemical Formula 3, $L^7$ may be or may include, e.g., a single bond or a substituted or unsubstituted C1 to C10 alkylene group, and $R^5$ may be, e.g., a group represented by Chemical Formula 2.

$R^5$ may be the same as defined in Chemical Formula 2.

When the binder resin includes the functional group represented by Chemical Formula 3 at the terminal end, the binder resin may also have a linking group including a carboxyl group (and/or a hydroxy group) at the terminal end (e.g., a pendant carboxyl group or pendant hydroxy group), and a taper angle of a pattern formed using an aqueous developing solution may be lowered and sensitivity may be more improved.

The binder resin may have a weight average molecular weight of about 3,000 g/mol to about 20,000 g/mol. When the binder resin has a weight average molecular weight within the ranges, excellent pattern-forming capability may be obtained, and a thin film may having excellent mechanical thermal characteristics may be provided.

The binder resin may be included in an amount of about 1 wt % to about 20 wt %, e.g., about 1 wt % to about 15 wt %, based on a total weight of the photosensitive resin composition. When the binder resin is included within the range, sensitivity, developability, resolution, and linearity of a pattern may be improved.

(B) Black Colorant

The black colorant in the photosensitive resin composition according to an embodiment may include an organic black pigment in order to help improve light-blocking properties and easily realize black.

In some compositions, only carbon black may be used as a black colorant in order to improve light-blocking properties, and when the carbon black is used alone, excellent optical density may be obtained, but other characteristics such as electrical characteristics and the like could be deteriorated.

According to an embodiment, when an organic black pigment is used as the black colorant, light-blocking properties may be relatively more deteriorated than when the carbon black is used alone but may bring about sufficient light-blocking performance and simultaneously may further improve the other characteristics such as electrical characteristics and the like.

For example, the black colorant in the photosensitive resin composition according to an embodiment may further include carbon black along with the organic black pigment and may further improve light-blocking properties. A black pigment by color mixing RGB black and the like besides the organic black pigment may be also used or each of them may be used.

When the organic black pigment or a mixture of the organic black pigment and carbon black that is an inorganic black pigment is used as the black colorant, a dispersing agent may be used therewith to disperse the pigment. For example, the pigment may be pretreated with the dispersing agent on the surface or added therewith to prepare the composition.

The dispersing agent may be a non-ionic dispersing agent, an anionic dispersing agent, a cationic dispersing agent, or the like. Examples of the dispersing agent may include polyalkylene glycol and esters thereof, polyoxyalkylene, a polyhydric alcohol ester alkylene oxide addition product, an alcohol alkylene oxide addition product, a sulfonate ester, a sulfonate salt, a carboxylate ester, a carboxylate salt, alkyl amide alkylene oxide addition product, alkyl amine, and the like, and these may be used alone or as a mixture of two or more.

Commercially available examples of the dispersing agent may include DISPERBYK-101, DISPERBYK-130, DISPERBYK-140, DISPERBYK-160, DISPERBYK-161, DISPERBYK-162, DISPERBYK-163, DISPERBYK-164, DISPERBYK-165, DISPERBYK-166, DISPERBYK-170, DISPERBYK-171, DISPERBYK-182, DISPERBYK-2000, DISPERBYK-2001 made by BYK Co., Ltd.; EFKA-47, EFKA-47EA, EFKA-48, EFKA-49, EFKA-100, EFKA-400, EFKA-450 made by EFKA Chemicals Co.; Solsperse 5000, Solsperse 12000, Solsperse 13240, Solsperse 13940, Solsperse 17000, Solsperse 20000, Solsperse 24000GR, Solsperse 27000, Solsperse 28000, and the like made by Zeneka Co.; or PB711, PB821, and the like made by Ajinomoto Inc.

The dispersing agent may be included in an amount of about 0.1 wt % to about 15 wt %, based on the total weight of the photosensitive resin composition. When the dispersing agent is included within the range, the composition has excellent stability, developability, and pattern-forming capability due to improved dispersion properties during manufacture of a black defining layer material.

The pigment may be pre-treated using a water-soluble inorganic salt and a wetting agent. When the pigment is pre-treated, an average particle diameter of the pigment may become finer.

The pre-treatment may be performed by kneading the pigment with a water-soluble inorganic salt and a wetting agent and then, filtering and washing the knead pigment.

The kneading may be performed at a temperature of about 40° C. to about 100° C., and the filtering and washing may be performed by filtering the pigment after washing away an inorganic salt with water and the like.

Examples of the water-soluble inorganic salt may include sodium chloride, potassium chloride, and the like. The wetting agent may make the pigment to be uniformly mixed with the water-soluble inorganic salt uniformly and be pulverized. Examples of the wetting agent include alkylene glycol monoalkyl ethers such as ethylene glycol monoethylether, propylene glycol monomethylether, diethylene glycol monomethylether, and the like, and alcohols such as ethanol, isopropanol, butanol, hexanol, cyclohexanol, ethylene glycol, diethylene glycol, polyethylene glycol, glycerine polyethylene glycol, and the like. These may be used alone or as a mixture of two or more.

The pigment after the kneading may have an average particle diameter ranging from about 5 nm to about 200 nm, e.g., about 5 nm to about 150 nm. When the pigment has an average particle diameter within the range, stability of pigment dispersion liquid may be improved and pixel resolution may not be deteriorated.

For example, the pigment may be used in a form of pigment dispersion liquid including the dispersing agent and a solvent which will be described below, and the pigment dispersion liquid may include a solid pigment, a dispersing agent, and a solvent. The solid pigment may be included in an amount of about 5 wt % to about 40 wt %, e.g., about 8 wt % to about 30 wt %, based on a total weight of the pigment dispersion liquid.

The black colorant may be included in a solid content of about 1 wt % to about 20 wt %, e.g., about 2 wt % to about 15 wt %, based on the total weight of the photosensitive resin composition. In an implementation, the black colorant may be included in an amount of about 15 wt % to about 50 wt %, e.g., about 20 wt % to about 40 wt % for a reference of the pigment dispersion liquid based on a total weight of the photosensitive resin composition. When the black colorant is included within the range, coloring effects and development performance may be improved.

(C) Photopolymerizable Monomer

The photopolymerizable monomer in the photosensitive resin composition according to an embodiment may be a single compound or a mixture of two or more different kinds of compounds.

When the photopolymerizable monomer is the mixture of two or more kinds of compounds, one of the two kinds of compounds may be a compound including at least two functional groups represented by Chemical Formula 4.

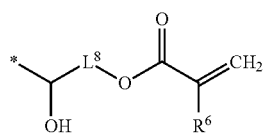

[Chemical Formula 4]

In Chemical Formula 4, $R^6$ may be or may include, e.g., a hydrogen atom or a substituted or unsubstituted C1 to C10 alkyl group, and $L^8$ may be or may include, e.g., a single bond or a substituted or unsubstituted C1 to C10 alkylene group.

For example the compound including at least two functional groups represented by Chemical Formula 4 may include 2 to 6 functional groups represented by Chemical Formula 4. In this case, during exposure of a pattern forming process, sufficient polymerization occurs and a pattern having improved heat resistance, light resistance, and chemical resistance may be formed.

In an implementation, the compound including at least two functional groups represented by Chemical Formula 4 may be a compound represented by Chemical Formula 5 or Chemical Formula 6.

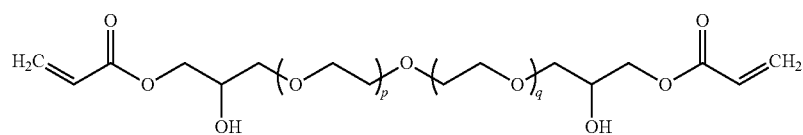

[Chemical Formula 5]

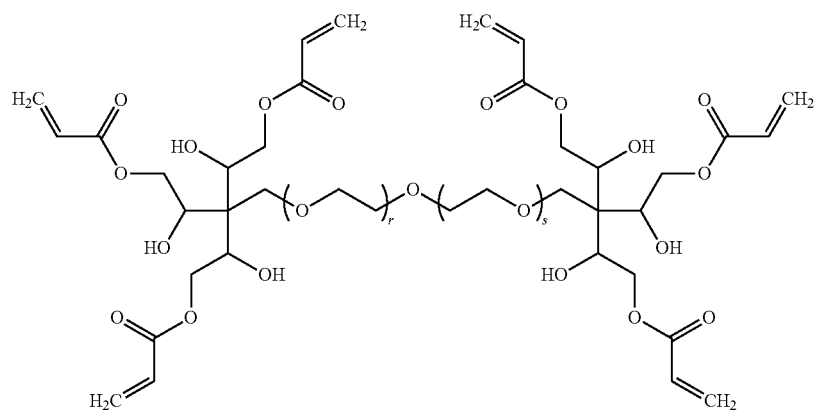

[Chemical Formula 6]

In Chemical Formula 5 and Chemical Formula 6, p, q, r, and s may each independently be an integer of 1 to 10.

When the photopolymerizable monomer is a mixture of two or more kinds of compounds, the other compound of the two kinds of compounds may be a monofunctional or multi-functional ester compound of (meth)acrylic acid having at least one ethylenic unsaturated double bond.

The monofunctional or multi-functional ester compound of the (meth)acrylic acid having at least one ethylenic unsaturated double bond may include, e.g., ethylene glycol di(meth)acrylate, diethylene glycol di(meth)acrylate, triethylene glycol di(meth)acrylate, propylene glycol di(meth)acrylate, neopentylglycol di(meth)acrylate, 1,4-butanediol di(meth)acrylate, 1,6-hexanediol di(meth)acrylate, bisphenol A di(meth)acrylate, pentaerythritol di(meth)acrylate, pentaerythritoltri(meth)acrylate, pentaerythritoltetra(meth)acrylate, pentaerythritol hexa(meth)acrylate, dipentaerythritol di(meth)acrylate, dipentaerythritoltri(meth)acrylate, dipentaerythritolpenta(meth)acrylate, dipentaerythritol hexa(meth)acrylate, bisphenol A epoxy(meth)acrylate, ethylene glycolmonomethylether (meth)acrylate, trimethylolpropanetri(meth)acrylate, tris(meth)acryloyloxyethyl phosphate, novolac epoxy (meth)acrylate, or a combination thereof.

Commercially available examples of the monofunctional or multi-functional ester compound of the (meth)acrylic acid having at least one ethylenic unsaturated double bond may be as follows. Examples of the mono-functional (meth) acrylic acid ester may include Aronix M-101®, M-111®, M-114® (Toagosei Chemistry Industry Co., Ltd.); KAY- ARAD TC-110S®, TC-120S® (Nippon Kayaku Co., Ltd.); V-158®, V-2311® (Osaka Organic Chemical Ind., Ltd.), and the like. Examples of a difunctional (meth)acrylic acid ester may include Aronix M-210®, M-240®, M-6200 (Toagosei Chemistry Industry Co., Ltd.), KAYARAD HDDA®, HX-220®, R-604® (Nippon Kayaku Co., Ltd.), V-260®, \T-312®, V-335 HP® (Osaka Organic Chemical Ind., Ltd.), and the like. Examples of a tri-functional (meth)acrylic acid ester may include Aronix M-309®, M-400®, M-405®, M-450®, M-7100®, M-8030®, M-8060® (Toagosei Chemistry Industry Co., Ltd.), KAYARAD TMPTA®, DPCA-20®, DPCA-30®, DPCA-60®, DPCA-120® (Nippon Kayaku Co., Ltd.), V-295®, V-300®, V-360®, V-GPT®, V-3PA®, V-400® (Osaka Yuki Kayaku Kogyo Co. Ltd.), and the like. The products may be used alone or as a mixture of two or more.

The photopolymerizable monomer may be treated with acid anhydride to improve developability.

The photopolymerizable monomer may be included in an amount of about 0.5 wt % to about 10 wt %, e.g., about 1 wt % to about 5 wt %, based on the total weight of the photosensitive resin composition. When the photopolymerizable monomer is included within the ranges, the reactive unsaturated compound is sufficiently cured during exposure in a pattern-forming process and has excellent reliability and thus, may form a pattern having improved heat resistance, light resistance, and chemical resistance and also, excellent resolution and close-contacting properties.

(D) Photopolymerization Initiator

The photosensitive resin composition according to an embodiment may include a photopolymerization initiator. The photopolymerization initiator may include, e.g., an acetophenone compound, a benzophenone compound, a thioxanthone compound, a benzoin compound, a triazine compound, an oxime compound, or the like.

Examples of the acetophenone compound may include 2,2'-diethoxy acetophenone, 2,2'-dibutoxy acetophenone, 2-hydroxy-2-methylpropinophenone, p-t-butyltrichloro acetophenone, p-t-butyldichloro acetophenone, 4-chloro acetophenone, 2,2'-dichloro-4-phenoxy acetophenone, 2-methyl-1-(4-(methylthio)phenyl)-2-morpholinopropan-1-one, 2-benzyl-2-dimethylamino-1-(4-morpholinophenyl)-butan-1-one, and the like.

Examples of the benzophenone compound may include benzophenone, benzoyl benzoate, benzoyl methyl benzoate, 4-phenyl benzophenone, hydroxy benzophenone, acrylated benzophenone, 4,4'-bis(dimethyl amino)benzophenone, 4,4'-bis(diethylamino)benzophenone, 4,4'-dimethylaminobenzophenone, 4,4'-dichlorobenzophenone, 3,3'-dimethyl-2-methoxybenzophenone, and the like.

Examples of the thioxanthone compound may include thioxanthone, 2-chlorothioxanthone, 2-methylthioxanthone, isopropyl thioxanthone, 2,4-diethyl thioxanthone, 2,4-diisopropyl thioxanthone, and the like.

Examples of the benzoin compound may include benzoin, benzoin methyl ether, benzoin ethyl ether, benzoin isopropyl ether, benzoin isobutyl ether, benzyldimethylketal, and the like.

Examples of the triazine compound may include 2,4,6-trichloro-s-triazine, 2-phenyl 4,6-bis(trichloromethyl)-s-triazine, 2-(3',4'-dimethoxystyryl)-4,6-bis(trichloromethyl)-s-triazine, 2-(4'-methoxynaphthyl)-4,6-bis(trichloromethyl)-s-triazine, 2-(p-methoxyphenyl)-4,6-bis(trichloromethyl)-s-triazine, 2-(p-tolyl)-4,6-bis(trichloro methyl)-s-triazine, 2-biphenyl 4,6-bis(trichloro methyl)-s-triazine, bis(trichloromethyl)-6-styryl-s-triazine, 2-(naphtho-1-yl)-4,6-bis(trichloromethyl)-s-triazine, 2-(4-methoxynaphthol-yl)-4,6-bis(trichloromethyl)-s-triazine, 2-4-bis(trichloromethyl)-6-piperonyl-s-triazine, 2-4-bis(trichloromethyl)-6-(4-methoxystyryl)-s-triazine, and the like.

Examples of the oxime compound may include an O-acyl oxime compound, 2-(O-benzoyloxime)-1-[4-(phenylthio) phenyl]-1,2-octandione, 1-(O-acetyloxime)-1-[9-ethyl-6-(2-methylbenzoyl)-9H-carbazol-3-yl]ethanone, O-ethoxycarbonyl-α-oxyamino-1-phenylpropan-1-one, and the like. Examples of the O-acyl oxime compound may be 1,2-octandione, 2-dimethylamino-2-(4-methylbenzyl)-1-(4-morpholin-4-yl-phenyl)-butan-1-one, 1-(4-phenylsulfanyl phenyl)-butane-1,2-dione-2-oxime-O-benzoate, 1-(4-phenylsulfanyl phenyl)-octane-1,2-dione-2-oxime-O-benzoate, 1-(4-phenylsulfanyl phenyl)-octan-1-oneoxime-O-acetate, and 1-(4-phenylsulfanyl phenyl)-butan-1-oneoxime-O-acetate.

The photopolymerization initiator may further include a carbazole compound, a diketone compound, a sulfonium borate compound, a diazo compound, an imidazole compound, a biimidazole compound, or the like, in addition the compounds described above.

The photopolymerization initiator may be included in an amount of about 0.1 wt % to about 5 wt %, e.g., about 0.1 wt % to about 3 wt %, based on the total weight of the photosensitive resin composition. When the photopolymerization initiator is included within the range, the composition may be sufficiently photopolymerized when exposed to light during the pattern-forming process for preparing a black pixel defining layer, accomplishing excellent sensitivity and improving transmittance.

(E) Solvent

The solvent is a material having compatibility with the binder resin, the pigment dispersion liquid including the black colorant, the photopolymerizable monomer, and the photopolymerization initiator, but not reacting therewith.

Examples of the solvent may include alcohols such as methanol, ethanol, and the like; ethers such as dichloroethylether, n-butylether, diisoamylether, methylphenylether, tetrahydrofuran, and the like; glycolethers such as ethylene glycolmonomethylether, ethylene glycolmonoethylether, ethylene glycoldimethylether, and the like; cellosolve acetates such as methylcellosolveacetate, ethylcellosolveacetate, diethylcellosolveacetate, and the like; carbitols such as methylethylcarbitol, diethylcarbitol, diethylene glycolmonomethylether, diethylene glycolmonoethylether, diethylene glycoldimethylether, diethylene glycolethylmethylether, diethylene glycoldiethylether, and the like; propylene glycolalkyletheracetates such as propylene glycolmethyletheracetate, propylene glycolpropyletheracetate, and the like; aromatic hydrocarbons such as toluene, xylene, and the like; ketones such as methylethylketone, cyclohexanone, 4-hydroxy-4-methyl-2-pentanone, methyl-n-propylketone, methyl-n-butylketone, methyl-n-amylketone, 2-heptanone, and the like; saturated aliphatic monocarboxylic acid alkyl esters such as ethyl acetate, n-butyl acetate, isobutyl acetate, and the like; lactate esters such as methyl lactate, ethyl lactate, and the like; oxyacetic acid alkyl esters such as oxy methyl acetate, oxy ethyl acetate, butyl oxyacetate, and the like; alkoxy acetic acid alkyl esters such as methoxy methyl acetate, methoxy ethyl acetate, methoxy butyl acetate, ethoxy methyl acetate, ethoxy ethyl acetate, and the like; 3-oxypropionic acid alkyl esters such as 3-oxymethyl propionate, 3-oxyethyl propionate, and the like; 3-alkoxy propionic acid alkyl esters such as 3-methoxymethyl propionate, 3-methoxyethyl propionate, 3-ethoxyethyl propionate, 3-ethoxymethyl propionate, and the like; 2-oxypropionic acid alkyl esters such as 2-oxymethyl propionate, 2-oxyethyl propionate, 2-oxy propyl propionate, and the like; 2-alkoxypropionic acid alkyl esters such as 2-methoxymethyl propionate, 2-methoxyethyl propionate, 2-ethoxyethyl propionate, 2-ethoxymethyl propionate, and the like; 2-oxy-2-methylpropionic acid esters such as 2-oxy-2-methylmethyl propionate, 2-oxy-2-methylethyl propionate, and the like; monooxymonocarboxylic acid alkyl esters of 2-alkoxy-2-methylpropionic acid alkyl such as 2-methoxy-2-methylmethyl propionate, 2-ethoxy-2-methylethyl propionate, and the like; esters such as 2-hydroxyethyl propionate, 2-hydroxy-2-methylethyl propionate, hydroxyl ethyl acetate, 2-hydroxy-3-methyl methyl butanoate, and the like; and ketonate esters such as ethyl pyruvate, and the like, and additionally a high boiling point solvent such as N-methylformamide, N,N-dimethyl formamide, N-methylformanilide, N-methylacetamide, N,N-dimethyl acetamide, N-methylpyrrolidone, dimethylsulfoxide, benzylethylether, dihexylether, acetylacetone, isophorone, caproic acid, caprylic acid, 1-octanol, 1-nonanol, benzylalcohol, benzyl acetate, ethyl benzoate, diethyl oxalate, diethyl maleate, γ-butyrolactone, ethylene carbonate, propylene carbonate, phenyl cellosolve acetate, and the like.

Considering miscibility and reactivity, glycol ethers such as ethylene glycol monoethylether, ethylene glycol dimethylether, ethylene glycol diethylether, diethylene glycolethylmethylether, and the like; ethylene glycol alkyl ether acetates such as ethyl cellosolve acetate, and the like; esters such as 2-hydroxyethyl propionate, and the like; carbitols such as diethylene glycolmonomethylether, and the like; propylene glycol alkyl ether acetates such as propylene glycolmonomethyl ether acetate, propylene glycolpropyletheracetate, and the like may be used.

The solvent may be included in a balance amount, e.g., about 30 wt % to about 70 wt %, based on the total weight of the photosensitive resin composition. When the solvent is included within the range, the photosensitive resin composition may have an appropriate viscosity resulting in improvement of coating characteristics of a black pixel defining layer.

(F) Other Additives

In an implementation, the photosensitive resin composition may further include an additive, e.g., malonic acid, 3-amino-1,2-propanediol, a silane coupling agent, a leveling agent, a surfactant, a radical polymerization initiator, or a combination thereof.

The silane coupling agent may have a reactive substituent of a vinyl group, a carboxyl group, a methacryloxy group, an isocyanate group, an epoxy group, or the like, in order to help improve close-contacting properties with a substrate.

Examples of the silane coupling agent may include trimethoxysilylbenzoic acid, γ-methacryloxypropyltrimethoxysilane, vinyltriacetoxysilane, vinyltrimethoxysilane, γ-isocyanatepropyltriethoxysilane, γ-glycidoxypropyltrimethoxysilane, β-(3,4-epoxycyclohexyl) ethyltrimethoxysilane, and the like. These may be used alone or in a mixture of two or more.

The silane coupling agent may be included in an amount of about 0.01 parts by weight to about 10 parts by weight, based on 100 parts by weight of the photosensitive resin composition. When the silane coupling agent is included within the range, close-contacting properties, storage properties, and the like may be improved.

The photosensitive resin composition may further include a surfactant, e.g., a fluorine surfactant and/or a silicone surfactant in order to help improve coating properties and prevent a defect if desired.

Examples of the fluorine surfactant may include a commercial fluorine surfactant such as BM-1000®, and BM-1100® (BM Chemie Inc.); MEGAFACE F 142D®, F 172®, F 173®, F 183® and F 554® (Dainippon Ink Kagaku Kogyo Co., Ltd.); FULORAD FC-135®, FULORAD FC-170C®, FULORAD FC-430®, and FULORAD FC-431® (Sumitomo 3M Co., Ltd.); SURFLON S-112®, SURFLON S-113®, SURFLON S-131®, SURFLON S-141®, and SURFLON S-145® (Asahi Glass Co., Ltd.); and SH-28PA®, SH-19®, SH-193®, SZ-6032®, and SF-8428®, and the like (Toray Silicone Co., Ltd.).

The silicone surfactant may include BYK-307, BYK-333, BYK-361N, BYK-051, BYK-052, BYK-053, BYK-067A, BYK-077, BYK-301, BYK-322, BYK-325, and the like, which are made by BYK Chem and commercially available.

The surfactant may be included in an amount of about 0.001 to about 5 parts by weight, based on 100 parts by weight of the photosensitive resin composition. When the surfactant is included within the range, excellent wetting on an IZO or ITO substrate or a glass substrate as well as coating uniformity may be secured, a stain may not be produced.

In an implementation, the photosensitive resin composition may include other additives such as an antioxidant, a stabilizer, and the like in a predetermined amount unless they deteriorate properties of the photosensitive resin composition.

The photosensitive resin composition according to an embodiment may be either positive or negative. In an implementation, the composition may be negative to completely remove residues in regions where a pattern is exposed after exposing and developing the composition having light-blocking properties.

Another embodiment provides a black pixel defining layer manufactured by exposure, development, and curing of the photosensitive resin composition.

A method of manufacturing the black pixel defining layer is as follows.

(1) Coating and Film Formation

The photosensitive resin composition may be coated to have a desired thickness on a substrate such as a glass substrate or an ITO substrate which undergoes a predetermined pretreatment, using a spin or slit coating, a roll coating method, a screen-printing method, an applicator method, and the like, and is heated at about 70° C. to about 110° C. for about 1 minute to 10 minutes to remove a solvent, forming a photosensitive resin layer.

(2) Exposure

The photosensitive resin layer may be patterned by disposing a mask and then, radiating an actinic ray of about 200 nm to about 500 nm. The radiation may be performed by using a light source such as a mercury lamp with a low pressure, a high pressure, or an ultrahigh pressure, a metal halide lamp, an argon gas laser, and the like. In an implementation, an X ray, an electron beam, and the like may be used.

The exposure process may use, e.g., a light dose of about 500 mJ/cm$^2$ or less (with a 365 nm sensor) when a high pressure mercury lamp is used. In an implementation, the light dose may vary depending on kinds of each component, its combination ratio, and a dry film thickness.

(3) Development

After the exposure process, an alkali aqueous solution may be used to develop the exposed film by dissolving and removing an unnecessary (e.g., unexposed) part except the exposed part, forming a pattern.

(4) Post-Treatment

The developed image pattern may be post-heated in order to accomplish excellent quality in terms of heat resistance, photo resistance, close contacting properties, crack-resistance, chemical resistance, high strength, storage stability, and the like. For example, after development, heat-treatment may be performed under a nitrogen atmosphere in a convection oven of about 250° C. for about 1 hour.

Another embodiment provides a display device including the black pixel defining layer.

The display device may be an organic light emitting diode (OLED).

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

EXAMPLES (Synthesis of Binder Resin)

Synthesis Example 1

0.04 mol of a compound represented by Chemical Formula A was dissolved (solid content of 20 wt %) in N-methyl-2-pyrrolidone (NMP) in a four-necked flask equipped with a stirrer, a thermostat, a nitrogen gas injector, and a condenser, at 35° C., while nitrogen was passed through the flask.

When the solid was completely dissolved, a solution obtained by dissolving 0.02 mol of 5-norbornene-2,3-dicarboxyl anhydride (solid content of 20 wt %) in N-methyl-2-pyrrolidone (NMP) was added thereto in a dropwise fashion at ambient temperature for 30 minutes. After reacting the mixture for 2 hours, 0.02 mol of pyridine was added thereto, and the obtained mixture was reacted at 80° C. for 4 hours and cooled down to ambient temperature.

A solution obtained by dissolving 0.03 mol of a compound represented by Chemical Formula B (solid content of 20 wt %) in NMP was added in a dropwise fashion thereto for 30 minutes. After reacting the mixture for 4 hours, 0.04 mol of pyridine and 0.1 mol of acetic anhydride were added thereto, and the obtained mixture was reacted at 70° C. for 5 hours. The resultant was cooled down to ambient temperature and added in a dropwise fashion to deionized water (DIW) in 5 times as much amount as the entire reaction solution for 3 hours to precipitate a solid and form a slurry. The slurry was filtered to obtain a wet cake. The wet cake is mixed with DIW in an equal amount, and the mixture was stirred for 30 minutes, filtered five times, and dried at 80° C. in a vacuum oven for 48 hours.

0.04 mol of trimellitic anhydride chloride was put in a flask, and diethylene glycol ethyl methyl ether (EDM) was added thereto, until the trimellitic anhydride chloride became 20 wt % to obtain a polymer. After dissolving the dry polymer to be 20 wt % in the EDM, 0.06 mol of pyridine was added thereto. This obtained solution was added in a dropwise fashion to the flask at 0° C. for 1 hour. When the dropwise addition was complete, the mixture was slowly heated up to 40° C. and reacted until a phenol group disappeared. When the reaction was complete, 0.04 mol of hydroxy ethyl acrylate was added thereto, the obtained mixture was reacted for 24 hours to all react the hydroxyl ethyl acrylate and then, precipitated in DIW in five times as much amount of as the entire solution. The obtained slurry was dissolved to be a theoretical solid content of 20 wt % in EDM, the solution was evaporated at 40° C. with a rotary evaporator, until a moisture therein became 500 ppm, to synthesize a binder resin represented by Chemical Formula 1-1. A weight average molecular weight of the binder resin represented by Chemical Formula 1-1 was 4,500 g/mol in terms of standard reduction to polystyrene according to a GPC (Gel Permeation Chromatography) method.

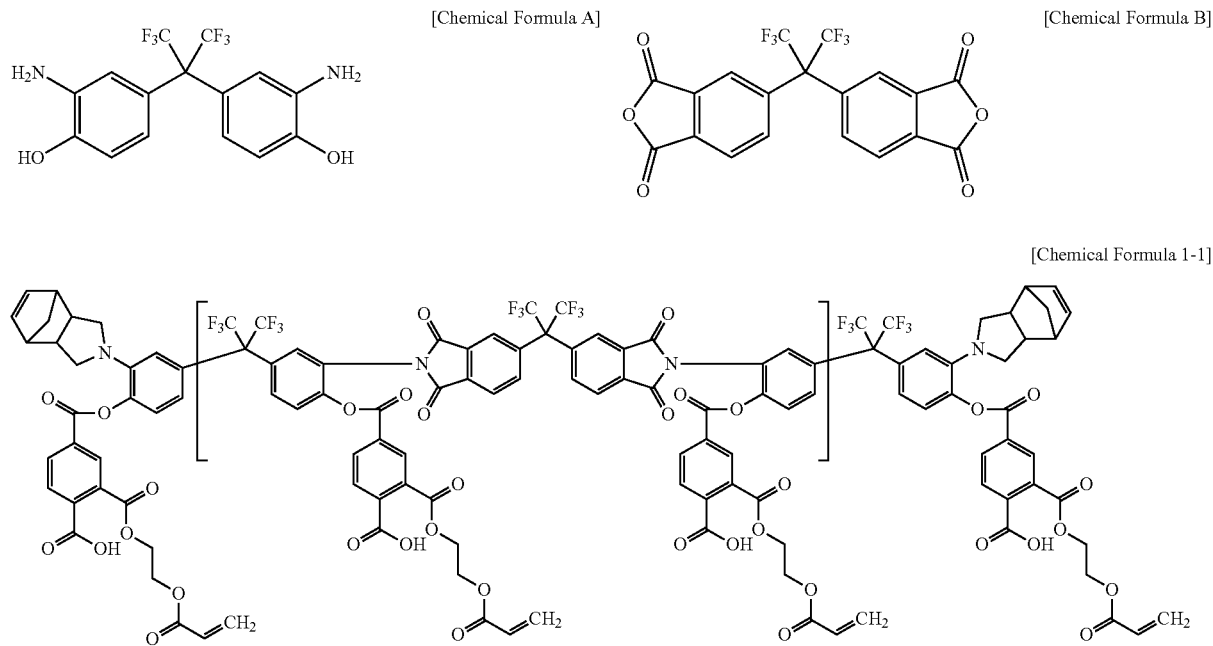

Synthesis Example 2

A binder resin represented by Chemical Formula 1-2 was synthesized according to the same method as Synthesis Example 1 except for using a compound represented by Chemical Formula C instead of the compound represented by Chemical Formula B. A weight average molecular weight of the binder resin represented by Chemical Formula 1-2 was 5,200 g/mol in terms of standard reduction to polystyrene according to a GPC (Gel Permeation Chromatography) method.

[Chemical Formula C]

[Chemical Formula 1-2]

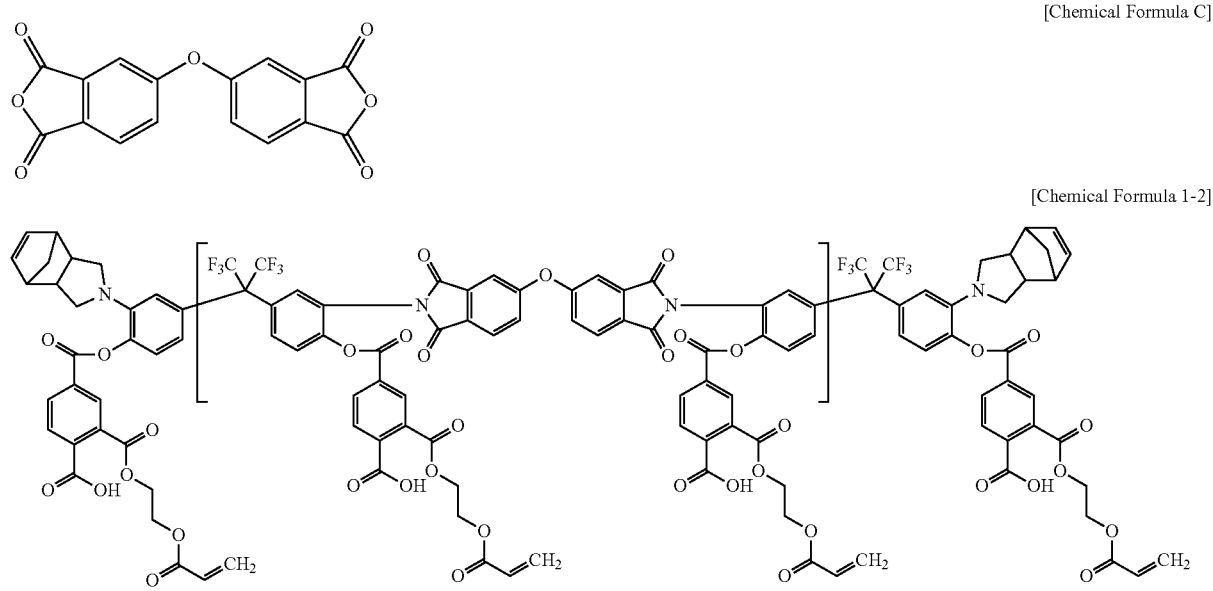

Synthesis Example 3

A binder resin represented by Chemical Formula 1-3 was synthesized according to the same method as Synthesis Example 1 except for using a compound represented by Chemical Formula D instead of the compound represented by Chemical Formula A. A weight average molecular weight of the binder resin represented by Chemical Formula 1-3 was 4,800 g/mol in terms of standard reduction to polystyrene according to a GPC (Gel Permeation Chromatography) method.

[Chemical Formula D]

[Chemical Formula 1-3]

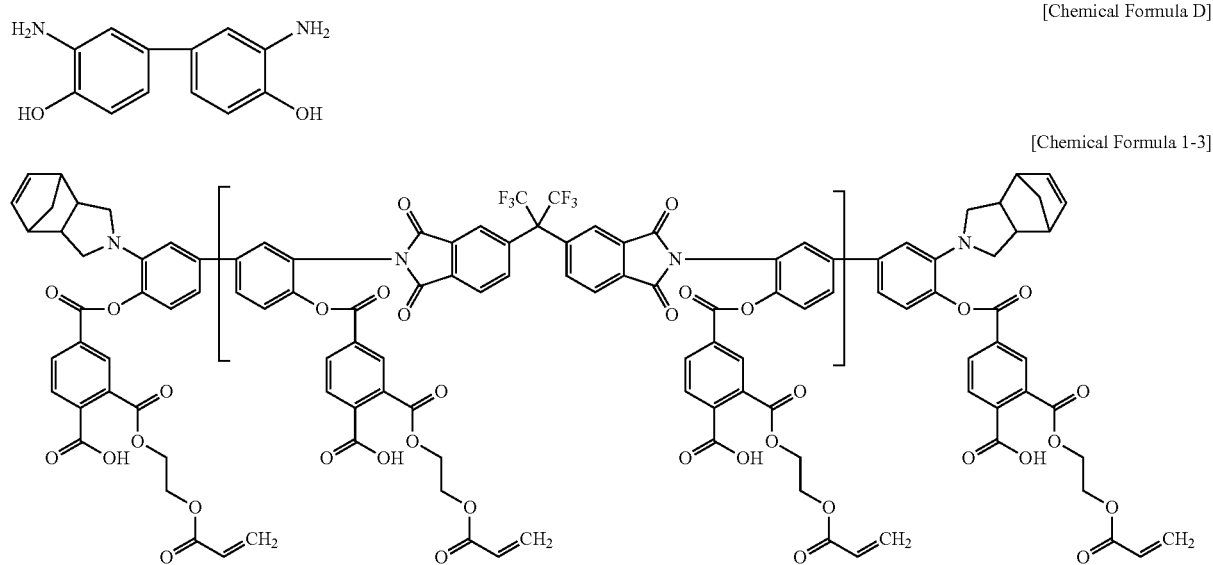

Synthesis Example 4

A binder resin represented by Chemical Formula 1-4 was synthesized according to the same method as Synthesis Example 1 except for using a compound represented by Chemical Formula D instead of the compound represented by Chemical Formula A and a compound represented by Chemical Formula C instead of the compound represented by Chemical Formula B. A weight average molecular weight of the binder resin represented by Chemical Formula 1-4 was 4,300 g/mol in terms of standard reduction to polystyrene according to a GPC (Gel Permeation Chromatography) method.

5 hours. The resultant was cooled down to ambient temperature and then, added in a dropwise fashion to DIW in five times as much an amount as the entire reaction solution for 3 hours to precipitate a solid and form a slurry. The slurry was filtered to obtain a wet cake. The wet cake was mixed with DIW in an equal amount, and the mixture was stirred for 30 minutes, 5 times filtered, and dried at 80° C. in a vacuum oven for 48 hours.

The dried resin was dissolved (solid content of 20 wt %) in ethylene glycol dimethyl ether (EDM)/methanol (a ratio of 3/7) in a flask. 0.08 mol of KOH was added to the flask. The mixed solution was evaporated to completely remove the solvent and obtain dry potassium salt. Subsequently,

[Chemical Formula 1-4]

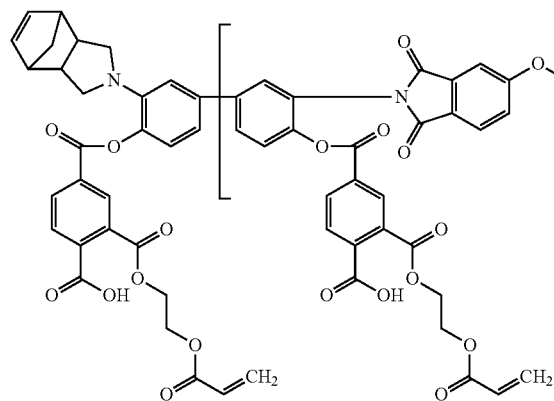
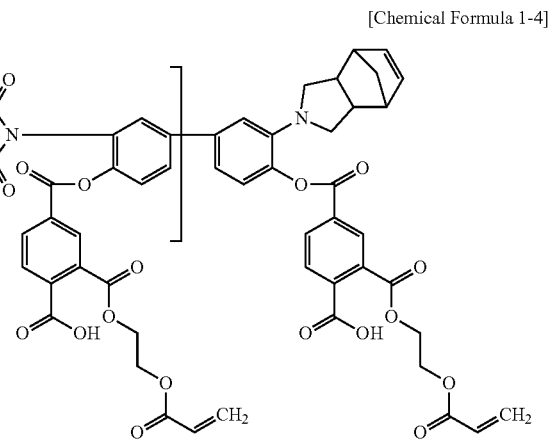

Synthesis Example 5

0.04 mol of a compound represented by Chemical Formula A was dissolved (solid content of 20 wt %) in N-methyl-2-pyrrolidone (NMP) in a four-necked flask equipped with an agitator, a temperature controller, a nitrogen gas injector, and a cooler at 35° C. while nitrogen was passed through the flask.

When the solid was completely dissolved, a solution obtained by dissolving 0.02 mol of 5-norbornene-2,3-dicarboxyl anhydride (solid content of 20 wt %) in N-methyl-2-pyrrolidone (NMP) was added thereto in a dropwise fashion at ambient temperature for 30 minutes. After reacting the mixture for 2 hours, 0.02 mol of pyridine was added thereto, and the obtained mixture was reacted at 80° C. for 4 hours and then, cooled down to ambient temperature.

0.03 mol of the compound represented by Chemical Formula B was dissolved (solid content of 20 wt %) in NMP, and the solution was added thereto in a dropwise fashion for 30 minutes. After reacting the mixture for 4 hours, 0.04 mol of pyridine and 0.1 mol of acetic anhydride were added thereto, and the obtained mixture was reacted at 70° C. for EDM was added thereto (solid content of 20 wt %), and 0.09 mol of epichlorohydrin was added thereto. The mixture was reacted at 90° C. for 24 hours. When the reaction was complete, the resultant was precipitated with DIW in five times as much an amount as the entire solution, dried in a 40° C. vacuum oven for 24 hours, and dissolved (solid content of 20 wt %) in toluene, 0.08 mol of acrylic acid was added thereto, and the mixture was reacted at 100° C. for 24 hours and cooled down to ambient temperature. Then, 0.08 mol of phthalic anhydride was added thereto, and the mixture was additionally reacted for 24 hours. The resultant was precipitated in DIW in five times as much an amount as the entire solution, and the slurry was washed five times. The slurry was dissolved to a theoretical solid content of 20 wt % in EDM, and the solution was evaporated at 40° C. by using a rotary evaporator, until moisture therein became 500 ppm, to synthesize a binder resin represented by Chemical Formula 1-5. A weight average molecular weight of the binder resin represented by Chemical Formula 1-5 was 5,500 g/mol in terms of standard reduction to polystyrene according to a GPC (Gel Permeation Chromatography) method.

[Chemical Formula 1-5]

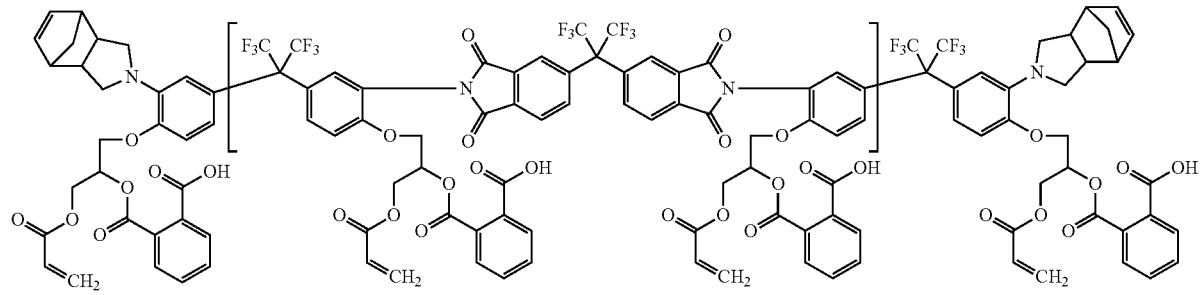

Synthesis Example 6

A binder resin represented by Chemical Formula 1-6 was synthesized according to the same method as Synthesis Example 5 except for using a compound represented by Chemical Formula C instead of the compound represented by Chemical Formula B. A weight average molecular weight of the binder resin represented by Chemical Formula 1-6 was 5,300 g/mol in terms of standard reduction to polystyrene according to a GPC (Gel Permeation Chromatography) method.

[Chemical Formula 1-6]

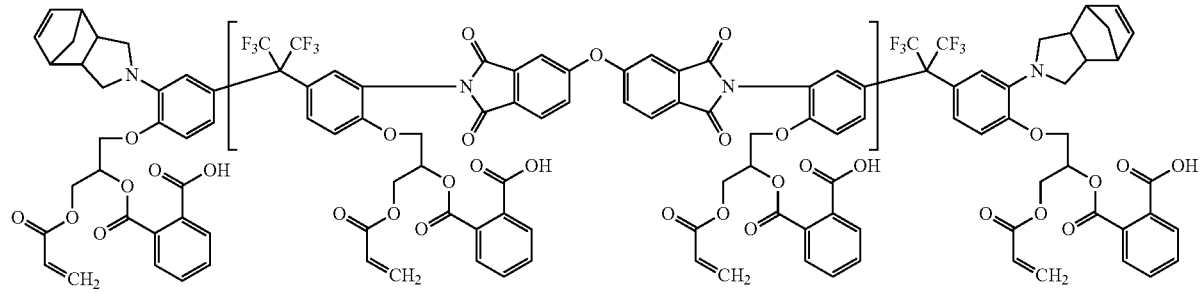

Synthesis Example 7

A binder resin represented by Chemical Formula 1-7 was synthesized according to the same method as Synthesis Example 5 except for using a compound represented by Chemical Formula D instead of the compound represented by Chemical Formula A. A weight average molecular weight of the binder resin represented by Chemical Formula 1-7 was 4,000 g/mol in terms of standard reduction to polystyrene according to a GPC (Gel Permeation Chromatography) method.

[Chemical Formula 1-7]

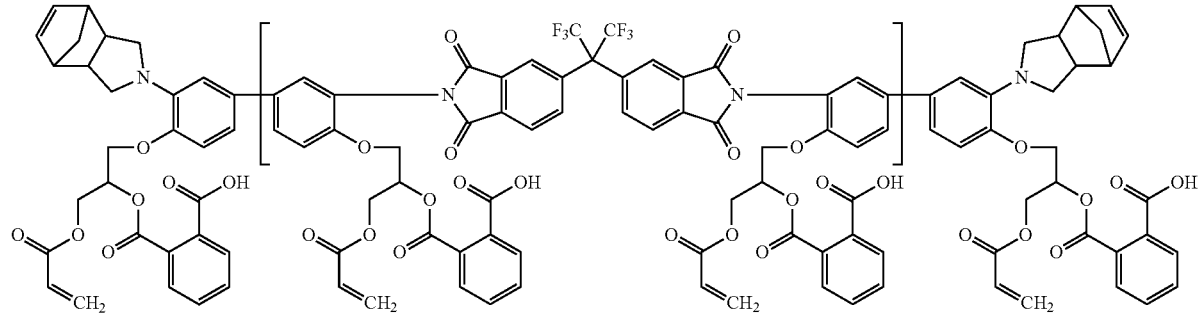

Synthesis Example 8

A binder resin represented by Chemical Formula 1-8 was synthesized according to the same method as Synthesis Example 5 except for using a compound represented by Chemical Formula D instead of the compound represented by Chemical Formula A and a compound represented by Chemical Formula C instead of the compound represented by Chemical Formula B. A weight average molecular weight of the binder resin represented by Chemical Formula 1-8 was 4,800 g/mol in terms of standard reduction to polystyrene according to a GPC (Gel Permeation Chromatography) method.

[Chemical Formula 1-8]

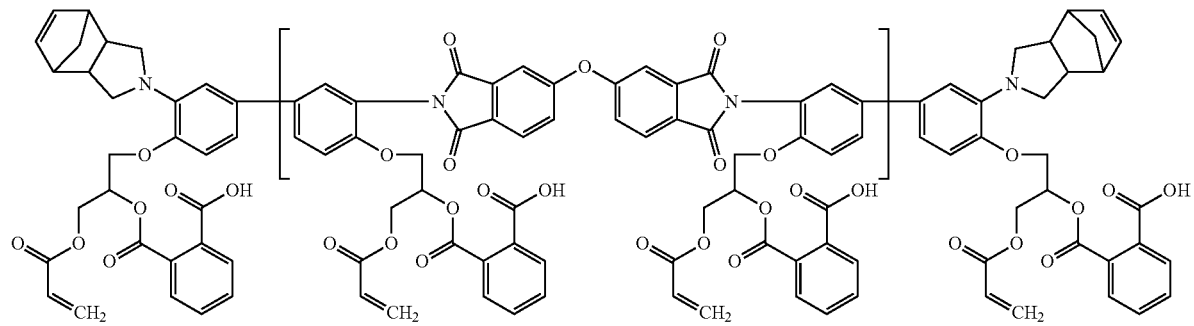

Comparative Synthesis Example 1

86.6 g of N-methyl-2-pyrrolidone (NMP) was put in a four-necked flask equipped with an agitator, a temperature controller, a nitrogen gas injector, and a cooler, while nitrogen was passed through the flask, and 12.3 g of 4,4' (hexafluoroisopropylidene)diphthalicanhydride (6-FDA) was added thereto and dissolved therein. When the solid was completely dissolved, 6.5 g of 3-aminophenyl sulfone (3-DAS) was added thereto, and the mixture was stirred at ambient temperature for 2 hours. Then, 5.6 g of pyridine was added thereto, and the mixture was stirred at 70° C. for 3 hours. A temperature in the reactor was cooled down to ambient temperature, 1.6 g of 2-hydroethylmethacrylate (HEMA) was added thereto, and the mixture was stirred for 6 hours. The reaction mixture was added to DIW in five times as much an amount as the solution to produce a precipitate, and the precipitate was filtered, sufficiently cleaned with water, and dried at 30° C. under vacuum for 24 hours. The dried binder was dissolved (solid content of 20 wt %) in EDM, and the solution was evaporated until moisture became 500 ppm to synthesize a binder resin represented by Chemical Formula X-1. A weight average molecular weight of the binder resin represented by Chemical Formula X-1 was 5,200 g/mol in terms of standard reduction to polystyrene according to a GPC (Gel Permeation Chromatography) method.

[Chemical Formula X-1]

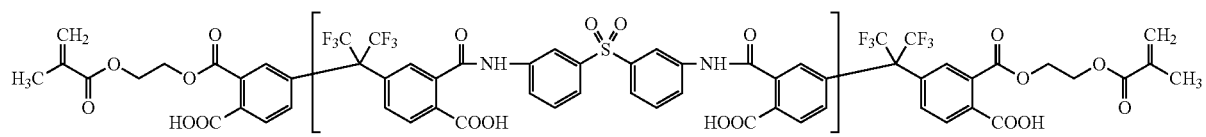

(Preparation of Photosensitive Resin Composition)

Examples 1 to 8 and Comparative Example 1

A photopolymerization initiator was dissolved in a solvent to have a composition shown in Table 1, and the solution was stirred at ambient temperature for 2 hours. Herein, a binder resin and a photopolymerizable monomer were added thereto, and the mixture was stirred at ambient temperature for one hour. Then, a surfactant (other additive) and a black colorant were added thereto, the obtained mixture was stirred for 1 hour at ambient temperature, and a solution obtained therefrom was entirely stirred for 2 hours. The solution was filtered three times to remove impurities and prepare each photosensitive resin composition.

TABLE 1

| | | Ex. 1 | Ex. 2 | Ex. 3 | Ex. 4 | Ex. 5 | Ex. 6 | Ex. 7 | Ex. 8 | Comp. Ex. 1 |
|---|---|---|---|---|---|---|---|---|---|---|
| | | | | | | (unit: g) | | | | |
| (A) binder resin | (A-1) | 4.5 | — | — | — | — | — | — | — | — |
| | (A-2) | — | 4.5 | — | — | — | — | — | — | — |
| | (A-3) | — | — | 4.5 | — | — | — | — | — | — |
| | (A-4) | — | — | — | 4.5 | — | — | — | — | — |
| | (A-5) | — | — | — | — | 4.5 | — | — | — | — |
| | (A-6) | — | — | — | — | — | 4.5 | — | — | — |
| | (A-7) | — | — | — | — | — | — | 4.5 | — | — |
| | (A-8) | — | — | — | — | — | — | — | 4.5 | — |
| | (A-9) | — | — | — | — | — | — | — | — | 4.5 |
| (B) black colorant | | 30 | 30 | 30 | 30 | 30 | 30 | 30 | 30 | 30 |
| (C) photo-polymerizable monomer | (C-1) | 0.8 | 0.8 | 0.8 | 0.8 | 0.8 | 0.8 | 0.8 | 0.8 | 0.8 |
| | (C-2) | 0.8 | 0.8 | 0.8 | 0.8 | 0.8 | 0.8 | 0.8 | 0.8 | 0.8 |
| (D) photo-polymerization initiator | | 1.2 | 1.2 | 1.2 | 1.2 | 1.2 | 1.2 | 1.2 | 1.2 | 1.2 |
| (E) solvent | (E-1) | 45.15 | 45.15 | 45.15 | 45.15 | 45.15 | 45.15 | 45.15 | 45.15 | 45.15 |
| | (E-2) | 17.5 | 17.5 | 17.5 | 17.5 | 17.5 | 17.5 | 17.5 | 17.5 | 17.5 |
| (F) other additive | | 0.05 | 0.05 | 0.05 | 0.05 | 0.05 | 0.05 | 0.05 | 0.05 | 0.05 |

(A) Binder Resin
(A-1) Binder resin of Synthesis Example 1
(A-2) Binder resin of Synthesis Example 2
(A-3) Binder resin of Synthesis Example 3
(A-4) Binder resin of Synthesis Example 4
(A-5) Binder resin of Synthesis Example 5
(A-6) Binder resin of Synthesis Example 6
(A-7) Binder resin of Synthesis Example 7
(A-8) Binder resin of Synthesis Example 8
(A-9) Binder resin of Comparative Synthesis Example 1
(B) Black colorant
Lactam organic black pigment dispersion liquid (CI-IM-126, SAKATA Corp.; Solid content of organic black pigment: 15 wt %)
(C) Photopolymerizable Monomer
(C-1) Dipentaerythritolhexa(meth)acrylate (DPHA, Nippon Kayaku Co., Ltd.)
(C-2) Compound represented by Chemical Formula Y (LTM II, BASF)
[Chemical Formula Y]

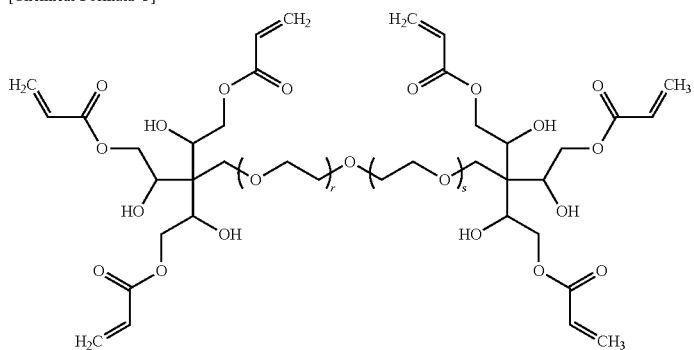

(in Chemical Formula Y, r and s are 2)
(D) Photopolymerization Initiator
Oxime initiator (NCI-831, ADEKA Corp.)
(E) Solvent
(E-1) Propylene glycol monomethyl ether acetate (PGMEA, Sigma-Aldrich Corporation)
(E-2) Ethylene glycol dimethyl ether (EDM, Sigma-Aldrich Corporation)
(F) Other Additives Surfactant (BYK-307, BYK Chem)

Evaluation

The photosensitive resin compositions according to Examples 1 to 8 and Comparative Example 1 were respectively coated on a 10 cm×10 cm ITO glass (resistance of 30Ω), heated on a 100° C. hot plate for 1 minute in a proxy type and then, for 1 minute in a contact type to form 1.2 μm-thick photosensitive resin films. The photosensitive resin films respectively coated on the substrate were exposed to light by using a mask having variously-sized patterns and changing an exposure dose with an exposer (UX-1200SM-AKS02 of Ushio Inc.) and then, developed in a 2.38% TMAH solution (an aqueous developing solution) at ambient temperature to dissolve the exposed region, and washed with pure water for 50 seconds to form patterns.

Sensitivity was evaluated by measuring each pattern size and calculating energy taken to realize a 20 μm pattern with a reference to a pattern size with MX51T-N633MU of Olympus Corp., and the results are shown in Table 2.

The sensitivity was measured by curing the substrates at 250° C. for 1 hour. Then, each taper angle was measured by analyzing their cross sections with a scanning electron microscope (S-4300 FE-SEM of Hitachi Ltd.), and the results are shown in Table 2.

TABLE 2

|  | Sensitivity (mJ/cm$^2$) | Taper Angle (°) |
| --- | --- | --- |
| Ex. 1 | 40 | 30 |
| Ex. 2 | 35 | 29 |
| Ex. 3 | 45 | 30 |
| Ex. 4 | 40 | 31 |
| Ex. 5 | 40 | 30 |
| Ex. 6 | 35 | 28 |
| Ex. 7 | 40 | 29 |
| Ex. 8 | 40 | 27 |
| Comp. Ex. 1 | 80 | 45 |

Referring to Table 2, the photosensitive resin composition according to Examples 1-8, e.g., which included a binder resin including the repeating unit represented by Chemical Formula 1, showed excellent sensitivity and maintained a low taper angle, compared with the photosensitive resin composition not including the binder resin.

By way of summation and review, the photosensitive resin layer (such as a pixel defining layer or the like) for a display device panel may have a small taper angle to help secure processability and device reliability. In addition, a colorant such as a pigment, a dye, or the like (absorbing light in a visible ray region) may be used in order to help secure light-blocking properties. In some layers, polyimide, polybenzoxazole, or a precursor thereof may be used as a binder resin of a photosensitive resin composition in order to obtain heat resistance, sensitivity, or low out-gas characteristics, but a contrast ratio during pattern formation after exposure could be decreased. Accordingly, a photosensitive resin composition for a black pixel defining layer may be capable of addressing the above concerns.

The embodiments may provide a photosensitive resin composition having low taper and excellent sensitivity.

A photosensitive resin composition according to an embodiment may include a binder resin including a specific repeating unit having a carboxyl group (and/or a hydroxy group) therein, and thus a black pixel defining layer having excellent sensitivity while maintaining a low taper and a display device including the same may be provided.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A photosensitive resin composition, comprising:
   a binder resin, repeating units of the binder resin consisting of a repeating unit represented by Chemical Formula 1;
   a black colorant;
   a photopolymerizable monomer;
   a photopolymerization initiator; and
   a solvent,

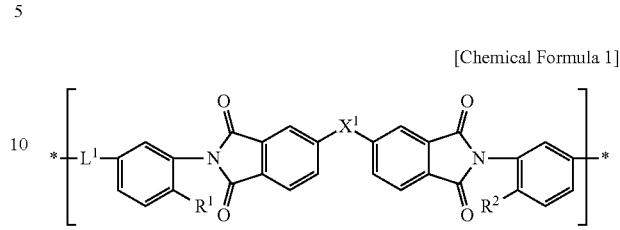

[Chemical Formula 1]

wherein, in Chemical Formula 1,
$X^1$ is an oxygen atom, a sulfur atom, or a substituted or unsubstituted C1 to C 10 alkylene group,
$L^1$ is a single bond or a substituted or unsubstituted C1 to C10 alkylene group, and
$R^1$ and $R^2$ are each independently a group represented by Chemical Formula 2,

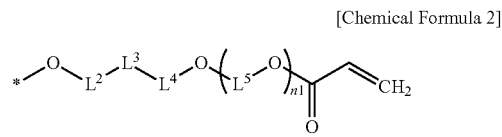

[Chemical Formula 2]

wherein, in Chemical Formula 2,
$L^2$ and $L^4$ are each independently —C(=O)— or a substituted or unsubstituted C1 to C10 alkylene group,
$L^5$ is a substituted or unsubstituted C to C10 alkylene group,
n1 is 0 or 1, and
$L^3$ is a group represented by Chemical Formula 2-1 or Chemical Formula 2-2:

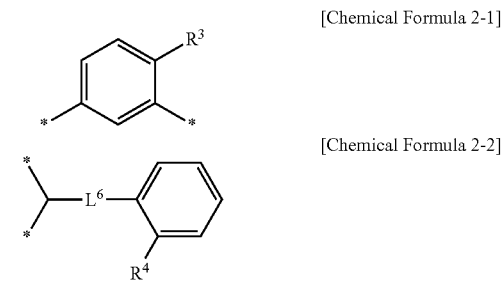

[Chemical Formula 2-1]

[Chemical Formula 2-2]

wherein, in Chemical Formula 2-1 and Chemical Formula 2-2,
$R^3$ and $R^4$ are each independently a hydroxy group or a carboxyl group, and
$L^6$ is an oxygen atom or —OC(=O)—.

2. The photosensitive resin composition as claimed in claim 1, wherein $X^1$ is an oxygen atom or a C1 to C10 alkylene group substituted with a halogen element-substituted C1 to C5 alkyl group.

3. The photosensitive resin composition as claimed in claim 1, wherein $L^1$ is a single bond or a C1 to C10 alkylene group substituted with a halogen element-substituted C1 to C5 alkyl group.

4. The photosensitive resin composition as claimed in claim 1, wherein the binder resin includes a functional group represented by Chemical Formula 3 at a terminal end thereof,

[Chemical Formula 3]

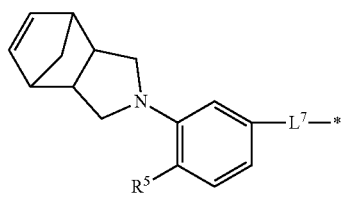

[Chemical Formula 5]

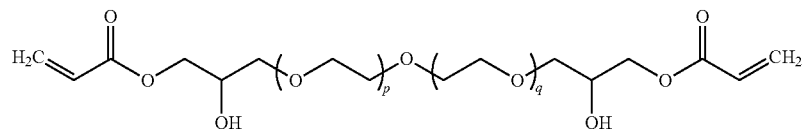

[Chemical Formula 6]

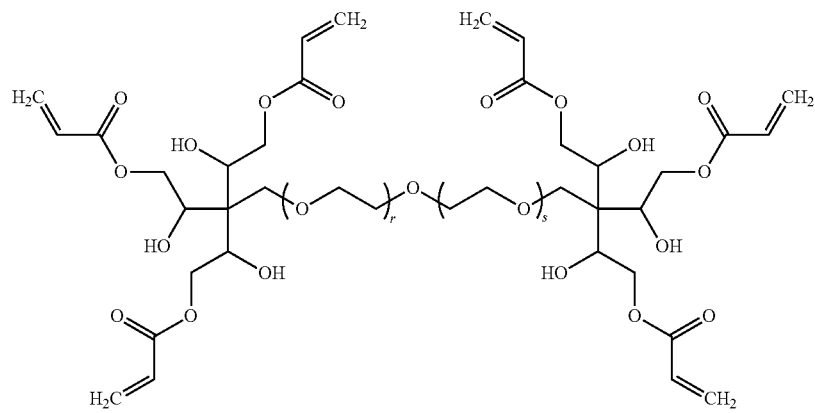

wherein, in Chemical Formula 3, $L^7$ is a single bond or a substituted or unsubstituted C1 to C10 alkylene group, and $R^5$ is a group represented by Chemical Formula 2.

5. The photosensitive resin composition as claimed in claim 1, wherein the binder resin has a weight average molecular weight of about 3,000 g/mol to about 20,000 g/mol.

6. The photosensitive resin composition as claimed in claim 1, wherein the black colorant includes an organic black pigment.

7. The photosensitive resin composition as claimed in claim 1, wherein the photopolymerizable monomer includes a compound including at least two functional groups represented by Chemical Formula 4:

[Chemical Formula 4]

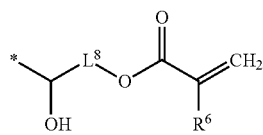

wherein, in Chemical Formula 4, $R^6$ is a hydrogen atom or a substituted or unsubstituted C1 to C10 alkyl group, and $L^8$ is a single bond or a substituted or unsubstituted C1 to C10 alkylene group.

8. The photosensitive resin composition as claimed in claim 7, wherein the compound including at least two functional groups represented by Chemical Formula 4 is a compound represented by Chemical Formula 5 or Chemical Formula 6:

wherein, in Chemical Formula 5 and Chemical Formula 6, p, q, r, and s are each independently an integer of 1 to 10.

9. The photosensitive resin composition as claimed in claim 1, wherein the photosensitive resin composition includes:

about 1 wt % to about 20 wt % of the binder resin;

about 1 wt % to about 20 wt % of the black colorant;

about 0.5 wt % to about 10 wt % of the photopolymerizable monomer;

about 0.1 wt % to about 5 wt % of the photopolymerization initiator; and the solvent, all wt% being based on a total weight of the photosensitive resin composition.

10. The photosensitive resin composition as claimed in claim 1, wherein the photosensitive resin composition further includes malonic acid, 3-amino-1,2-propanediol, a silane coupling agent, a leveling agent, a surfactant, a radical polymerization initiator, or a combination thereof.

11. A photosensitive resin composition, comprising:

a binder resin;

a black colorant;

a photopolymerizable monomer;

a photopolymerization initiator; and a solvent, wherein the binder resin is represented by one of the following Chemical Formulae 1-1 to 1-8:

[Chemical Formula 1-1]
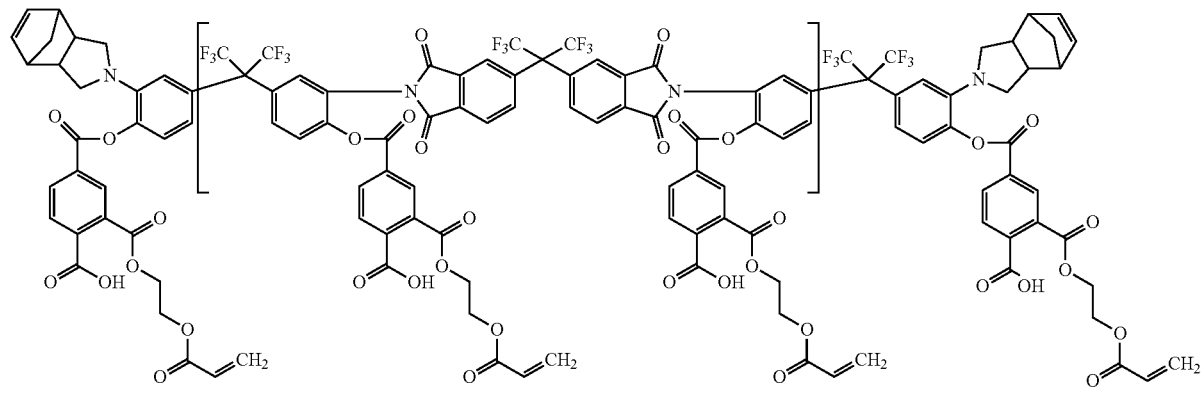
[Chemical Formula 1-2]
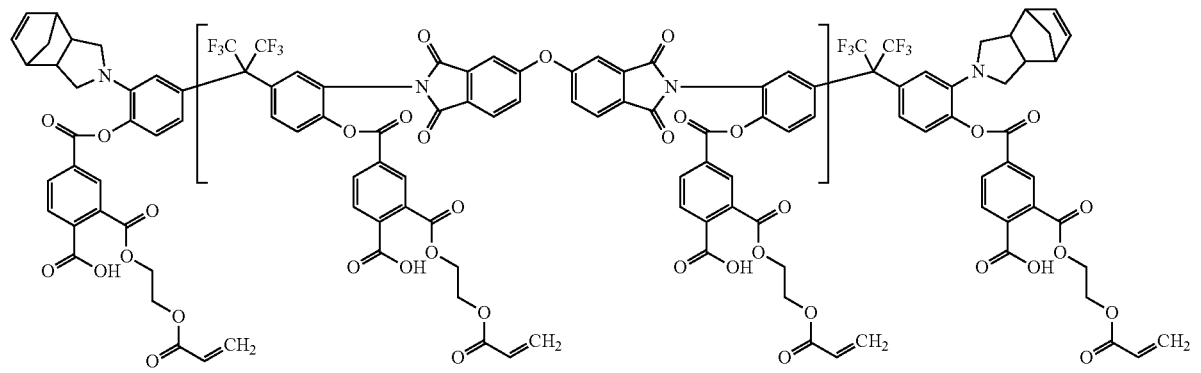
[Chemical Formula 1-3]
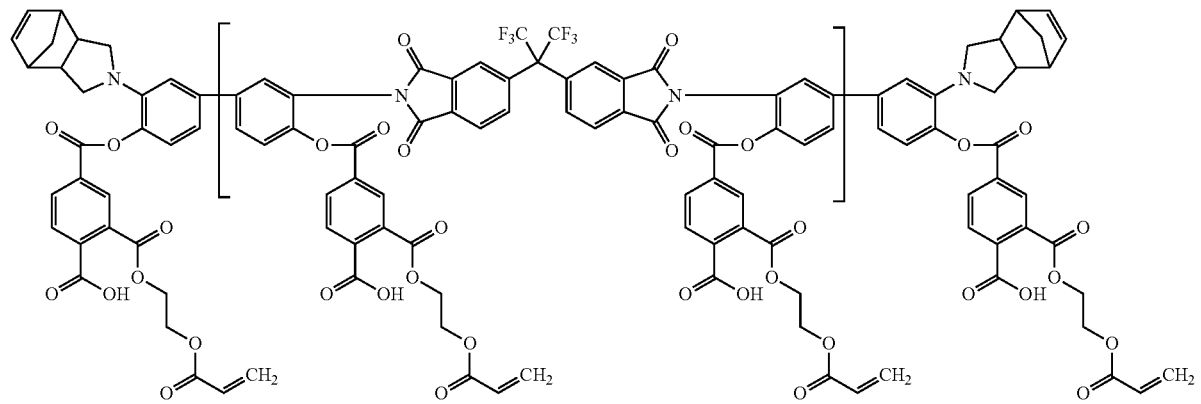
[Chemical Formula 1-4]
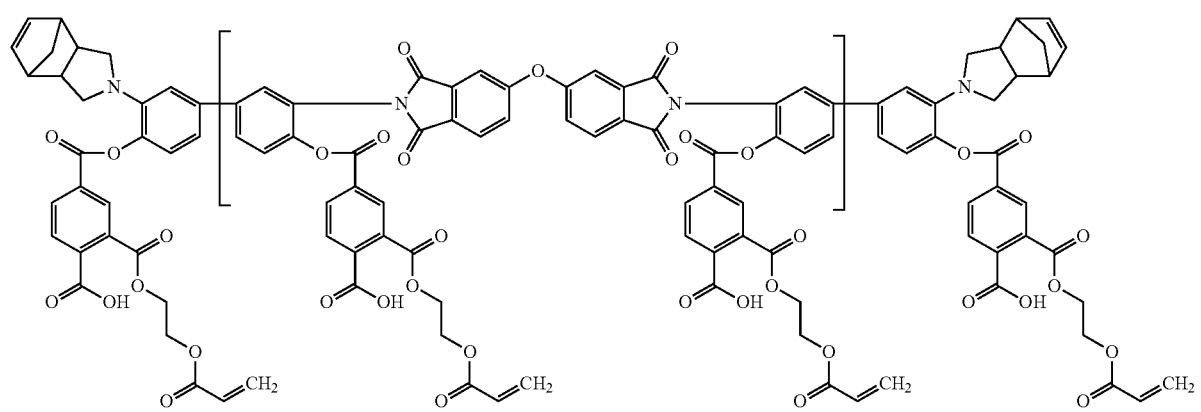

[Chemical Formula 1-5]

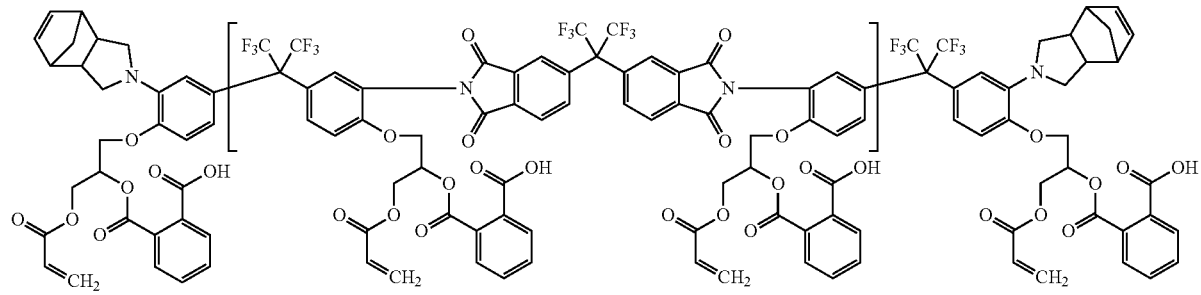

[Chemical Formula 1-6]

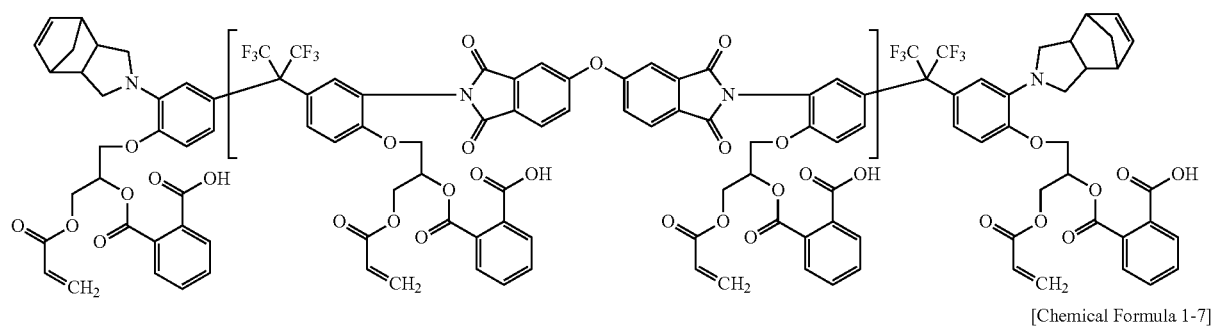

[Chemical Formula 1-7]

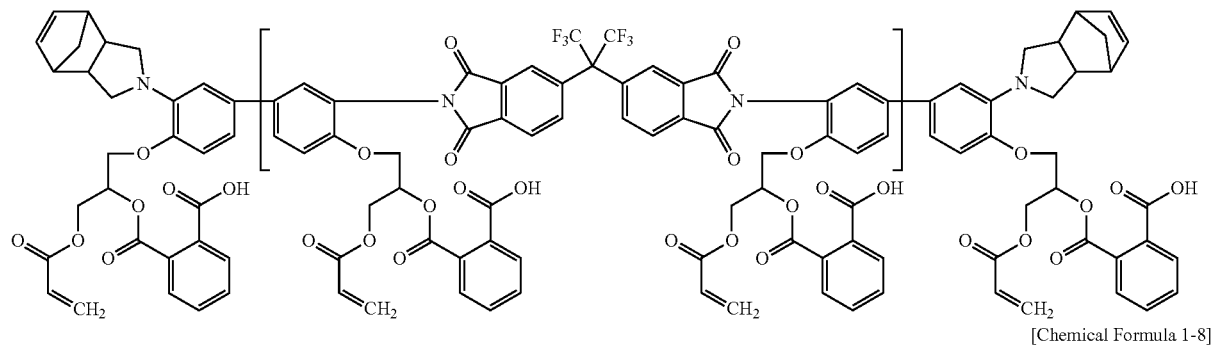

[Chemical Formula 1-8]

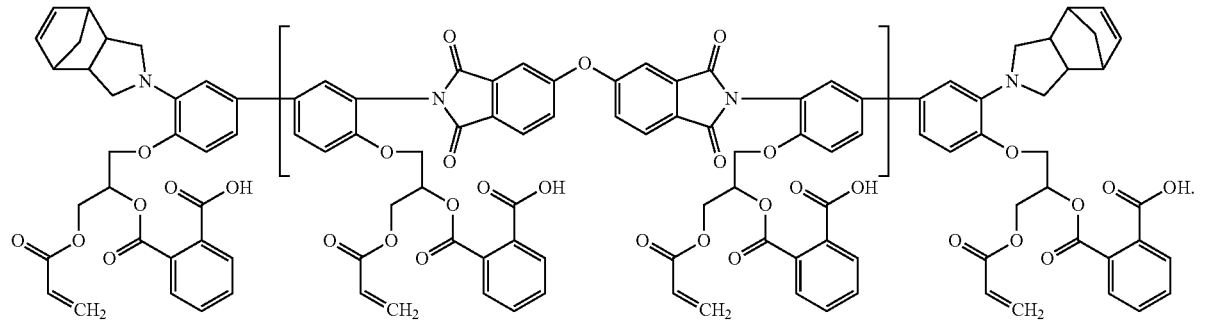

12. A black pixel defining layer manufactured using the photosensitive resin composition as claimed in claim 1.

13. A display device comprising the black pixel defining layer as claimed in claim 12.

14. The display device as claimed in claim 13, wherein the display device is an organic light emitting diode (OLED).

* * * * *